United States Patent
Neerhof

(10) Patent No.: US 7,110,090 B2
(45) Date of Patent: Sep. 19, 2006

(54) LITHOGRAPHIC APPARATUS AND METHOD TO DETECT CORRECT CLAMPING OF AN OBJECT

(75) Inventor: Hendrik Antony Johannes Neerhof, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 154 days.

(21) Appl. No.: 10/776,644

(22) Filed: Feb. 12, 2004

(65) Prior Publication Data

US 2004/0223127 A1    Nov. 11, 2004

(30) Foreign Application Priority Data

Feb. 12, 2003    (EP)    ................... 03075415

(51) Int. Cl.
  *G03B 27/58*    (2006.01)
  *G03B 27/42*    (2006.01)

(52) U.S. Cl. .......................... 355/72; 355/53

(58) Field of Classification Search .................. 355/53, 355/72–76; 361/234; 310/10, 12; 378/34, 378/35
See application file for complete search history.

(56) References Cited

U.S. PATENT DOCUMENTS

| | | | |
|---|---|---|---|
| 4,737,824 A * | 4/1988 | Sakai et al. ................ | 355/53 |
| 5,191,218 A | 3/1993 | Mori et al. | |
| 6,125,025 A | 9/2000 | Howald et al. | |
| 6,135,858 A * | 10/2000 | Takahashi ................. | 451/41 |
| 6,226,133 B1 | 5/2001 | Osakabe | |
| 6,401,359 B1* | 6/2002 | Amano ...................... | 34/402 |
| 6,402,843 B1 | 6/2002 | Siniaguine et al. | |
| 6,576,483 B1 | 6/2003 | Chou et al. | |
| 6,590,633 B1 | 7/2003 | Nishi et al. | |
| 6,853,953 B1* | 2/2005 | Brcka et al. ............... | 702/182 |
| 2001/0005595 A1 | 6/2001 | Moritia et al. | |

FOREIGN PATENT DOCUMENTS

| | | |
|---|---|---|
| JP | 6-1079228 | 4/1986 |
| JP | 4-61220 | 2/1992 |
| JP | 10-270535 | 10/1998 |
| JP | 11-087480 | 3/1999 |
| KR | 2003053342 A | 6/2003 |
| WO | WO 01/84241 A1 | 11/2001 |
| WO | WO 02/065213 A1 | 8/2002 |

OTHER PUBLICATIONS

European Search Report for European Application No. 03075415.4, dated Jan. 20, 2004.

* cited by examiner

*Primary Examiner*—Henry Hung Nguyen
(74) *Attorney, Agent, or Firm*—Pillsbury Winthrop Shaw Pittman LLP

(57) ABSTRACT

A lithographic apparatus includes a support structure adapted to clamp an object. The support structure and the object clamped thereon define a compartment. The supply structure is connected to the compartment and supplies a fluid to the compartment. The supply structure includes a meter to measure a change in at least one of flow velocity of the fluid and pressure of the fluid.

17 Claims, 3 Drawing Sheets

LITHOGRAPHIC APPARATUS AND METHOD TO DETECT CORRECT CLAMPING OF AN OBJECT

The present application claims priority to European Application No. 03075415.4, filed on Feb. 12, 2003, the entirety of which is hereby incorporated into the present application by reference thereto.

BACKGROUND OF THE INVENTION

1. Field of the Invention

The invention relates to a lithographic projection apparatus.

2. Brief Description of Related Art

In a lithographic projection apparatus in general, it is of paramount importance to be able to detect whether or not an object has been placed correctly on a support structure. This may for instance be the case for a wafer on a wafer table or for a mask on a mask table. To this end the support structure and/or the object are designed such that together, i.e. with an object placed on the support structure they define a closed space. In a lithographic apparatus working under atmospheric conditions an object is normally connected to a support structure, or "clamped", by evacuating the closed space. The presence of an object on the support structure is then detected by measuring the pressure in the space or flow from the space. When an object is present, the pressure or flow is different from the case when no object is present. This principle is, however, not feasible for a lithographic apparatus working under relatively high vacuum conditions such as lithographic apparatus using extreme ultraviolet radiation (EUV).

In such a vacuum environment clamping is effected by electrostatic forces. Capacitive measurements have been proposed in order to detect whether an object has been placed correctly or has good contact. Such measurements are also not very well feasible, because of the sensitivity to electromagnetic disturbances, or due to the large variety of object materials each having different electrical properties, causing different changes in capacitances.

From the above, it is clear that a problem in the present state of the art is to assess, under vacuum conditions, whether or not an object has been placed correctly on a support structure, like e.g. a wafer on a wafer table, a so called "handler clamp" or an "exposure pin", or a mask on a chuck.

A solution for the problem is for example proposed in the U.S. Pat. No. 6,576,483 B1 in which a system for supporting and clamping a semiconductor wafer is disclosed. The known system comprises an electrode and a clamp between which the wafer can be clamped. The electrode comprises a cannelure open towards the backside of the wafer, whereby the cannelure exposes the backside to a gas piped through one or more holes provided in the electrode. The holes are connected in turn to a gas supply structure. The cannelure of the known system has a size such that deviation of the wafer from its proper position by more than a threshold partially exposes the cannelure, such that the gas leaks from the cannelure. The supply structure comprises a gas flow detector for detecting gas leaking from the cannelure and provides corresponding detection of the wafer deviating from its proper position.

A similar solution is proposed in U.S. Pat. No. 6,401,359 B1, which discloses a system capable of detecting leakage of a heat-transfer gas supplied to a space between a wafer and a mounting stand supporting the wafer in order to determine whether or not the wafer is correctly placed on the mounting stand. The system disclosed in U.S. Pat. No. 6,401,359 B1 uses a flowmeter to perform the detection. The flowmeter measures the flowrate of the gas and compares it by a comparator against a threshold value.

A drawback of the known systems is that when used in a lithographic apparatus using high vacuum, the actual detection of a misplaced wafer or mask may take to long, i.e. an unacceptable amount of gas may be released into the vacuum space surrounding the object.

SUMMARY OF THE INVENTION

It is therefore an aspect of the present invention to provide a lithographic apparatus which, under vacuum conditions, at least partially eliminates the above-mentioned drawback or at least to provide an alternative to the known systems.

In particular, it is an aspect of the present invention to provide a lithographic apparatus in which the correct placement of an object, such as a wafer or a mask, on a support structure, such as a wafer table or a mask table respectively, can be quickly determined irrespective of any EM disturbances and irrespective of the electrical properties of the object.

This aspect may be achieved by a lithographic apparatus according to claim 1. The lithographic apparatus comprises at least one support structure adapted to clamp an object thereon. The support structure and the object clamped on the support structure define a compartment, and the supply structure is in communication with the compartment. The supply structure are constructed and arranged to supply a fluid to the compartment, wherein the supply structure comprise a meter arranged to measure a change in at least one of flow velocity of the fluid and pressure of the fluid as a function of time, in order to detect whether or not the object is correctly clamped on the support structure.

By pumping a (back-fill) gas in the space between an object (e.g. a wafer) and a support structure (e.g. the wafer table or the support structures mentioned above) it is possible to detect the correct placement of the wafer on the wafer table as explained above. Since, if the back-fill gas can escape from the chamber, which can be determined by measuring the pressure in and/or the flow to the space, the wafer is not correctly placed. By measuring a change in the flow velocity or pressure of the fluid, it is no longer necessary to wait and see whether or not the expected end value of the flow velocity or the pressure of the fluid will be reached. When the object is not clamped correctly on the support structure, the flow velocity will not reach a (near) zero value or the pressure will not reach its expected end value but a lower one. This means in both cases that in case of a misplaced object, the change in flow velocity or in pressure as a function of time will be different, i.e. smaller, compared to the case in which the object is correctly clamped. Such a measurement can be made almost directly after supplying of the fluid to the compartment has begun. When the typical progress of the flow velocity and/or pressure of the fluid in the compartment is determined for a correctly clamped object, an early measurement in time will reveal whether or not the measured value of the flow velocity or pressure, i.e. the actual progress of that value, corresponds with the determined progress.

In a further embodiment the meter is a flow velocity meter connected to a control unit arranged to receive a value representative of the flow velocity of the fluid and arranged to determine a change in the flow velocity of the fluid as a function of time and to compare the change with a predetermined value of the change. This makes it possible to detect at an early stage whether the wafer is correctly placed or not. If the wafer is correctly placed the flow velocity will drop more rapidly than will be the case when the wafer is not correctly placed. Eventually, the flow velocity will reach zero for a correctly placed wafer in a finite period of time, whereas for an incorrectly placed wafer zero will be no more than approached.

In a further embodiment that the meter is a pressure meter connected to a control unit arranged to receive a value representative of the pressure of the fluid and arranged to determine a change in the flow velocity of the fluid as a function of time and to compare the change with a predetermined value of the change. Again there is a difference in the pressure increase as a function of time which makes the detection of a correct placement of the wafer possible. An arbitrary predetermined pressure (and also the predetermined final pressure) will be reached more rapidly in the case of a correct wafer placement.

In a further embodiment the at least one support structure comprises a first support structure for supporting a patterning device, the patterning device serving to pattern the projection beam according to a desired pattern, a second support structure for holding a substrate, and wherein the apparatus further comprises a radiation system for providing a projection beam of radiation and a projection system for projecting the patterned beam onto a target portion of the substrate, and wherein at least one of the patterning device or the substrate is clamped on the first support structure or the second support structure, respectively.

In a further embodiment the fluid is a gas comprising argon. Argon is an inert gas which has the advantage that is does not easily react with its environment and is clearly distinguishable from helium used in leak detection. Gases such as, for instance, nitrogen and oxygen are other possibilities.

In a further embodiment the supply structure is adapted to increase the pressure in the compartment from a first level to a second level during a predetermined period of time and subsequently decreasing the pressure from the second level to a third level. A temporary increase in pressure on the object will serve as a test to establish whether the clamp force is sufficient to hold the object during accelerations which will be exerted on the object during transportation in the lithographic projection apparatus.

An aspect of the invention also relates to a method to detect correct clamping of an object on a support structure which support structure and which object clamped on the support structure define a compartment, the method comprising: supplying a fluid, in particular a gas to the compartment; measuring a change in at least one of flow velocity of the fluid and pressure of the fluid as a function of time.

An aspect of the invention further relates to a computer program product to be loaded by a control unit in a lithographic projection apparatus according to an embodiment of the present invention, the computer program product comprising instructions and data to allow the control unit to perform the method mentioned above.

An aspect of the invention further relates to a computer system to detect correct clamping of an object on a support structure, which support structure and which object clamped on the support structure define a compartment, the system comprising: means for supplying a fluid to the compartment; and means for measuring a change in at least one of flow velocity of the fluid and pressure of the fluid as a function of time.

An aspect of the invention further relates to a data carrier provided with a computer program product as mentioned above.

An aspect of the invention further relates to a computer-readable medium encoded with a computer program to detect correct clamping of an object on a support structure, which support structure and which object clamped on the support structure define a compartment, the program comprising: supplying a fluid to the compartment; and measuring a change in at least one of flow velocity of the fluid and pressure of the fluid as a function of time.

An aspect of the invention further relates to a support structure for use in a lithographic apparatus according to an embodiment of the present invention.

An aspect of the invention further relates to a support structure assembly for use in a lithographic apparatus, comprising: at least one support structure adapted to clamp an object thereon, said support structure and the object clamped on said support structure defining a compartment, and a supply structure in communication with said compartment, said supply structure being constructed and arranged to supply a fluid to said compartment, wherein said supply structure includes a meter arranged to measure a change in at least one of flow velocity of said fluid and pressure of said fluid as a function of time, in order to detect whether or not the object is correctly clamped on said support structure.

The term "patterning device" or "patterning structure" as employed above should be broadly interpreted as referring to a device or structure that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below).

An example of such patterning device includes a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of such patterning device includes a programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing a piezoelectric actuation device. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The matrix addressing can be performed using suitable electronic devices. In both of the situations described hereabove, the patterning device can comprise one or more programmable mirror arrays. In the case of a programmable mirror array, the support structure may be embodied as a frame or table, for example, which may be fixed or movable.

Still another example of such patterning device includes a programmable LCD array. As above, the support structure in this case may be embodied as a frame or table, for example, which may be fixed or movable.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper or step-and-repeat apparatus. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are provided, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures.

Although specific reference may be made in this text to the use of the apparatus according to an embodiment of the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

BRIEF DESCRIPTION OF THE DRAWINGS

Aspects of the invention will now be explained in connection with the accompanying drawings, which are only intended to show examples and not to limit the scope of protection, and in which.

DETAILED DESCRIPTION OF ILLUSTRATED EMBODIMENTS

Figure 1:
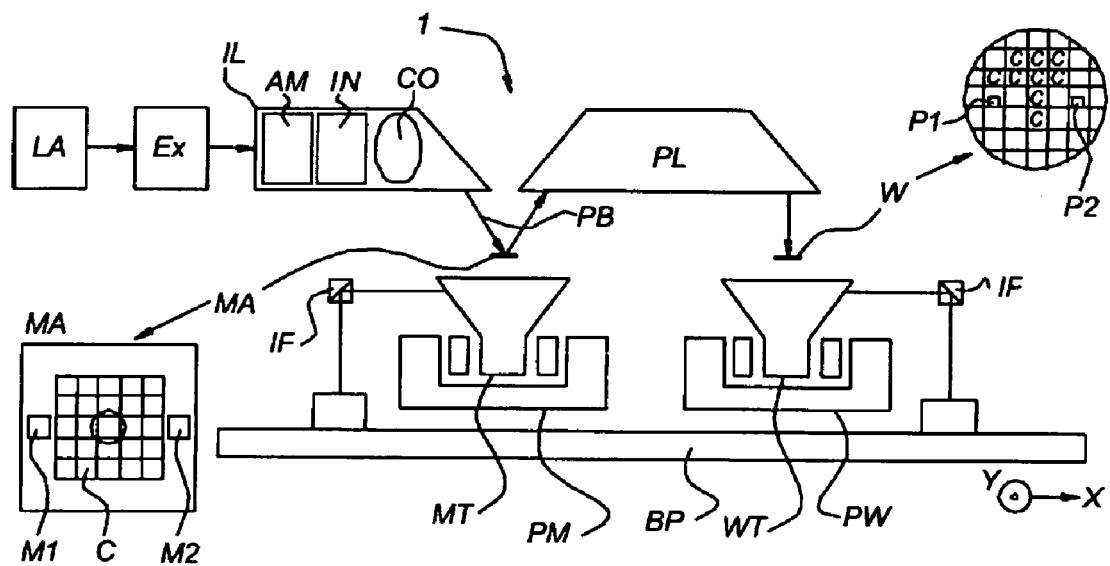
FIG. 1 is a schematic general overview of an embodiment of a lithographic projection apparatus in accordance with the invention.

FIG. 1 schematically depicts a lithographic projection apparatus 1 according to an embodiment of the invention. The apparatus comprises: a radiation system Ex, IL, for supplying a projection beam PB of radiation (e.g. EUV radiation) with a wavelength of 11–14 nm. In this particular case, the radiation system also comprises a radiation source LA; a first object table (mask table) MT provided with a mask holder for holding a patterning device, illustrated in the form of the mask MA (e.g. a reticle), and connected to first positioning structure PM for accurately positioning the mask with respect to item PL; a second object table (substrate table) WT provided with a substrate holder for holding a substrate W (e.g. a resist-coated silicon wafer), and connected to a second positioning structure PW for accurately positioning the substrate with respect to item PL; and a projection system ("lens") PL for imaging an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning device, such as a programmable mirror array of a type as referred to above.

The source LA (e.g. a laser-produced plasma or a discharge plasma EUV radiation source) produces a beam of radiation. This beam is fed into an illumination system (illuminator) IL, either directly or after having traversed a conditioning structure, such as a beam expander Ex, for example. The illuminator IL may comprise an adjuster AM that sets the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. Aspects of the invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning structure PW (and interferometric measuring device IF), the substrate table WT can be moved accurately, e.g. so as to position different target portions C in the path of the beam PB. Similarly, the first positioning structure PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus may be used in two different modes.

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image.

Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
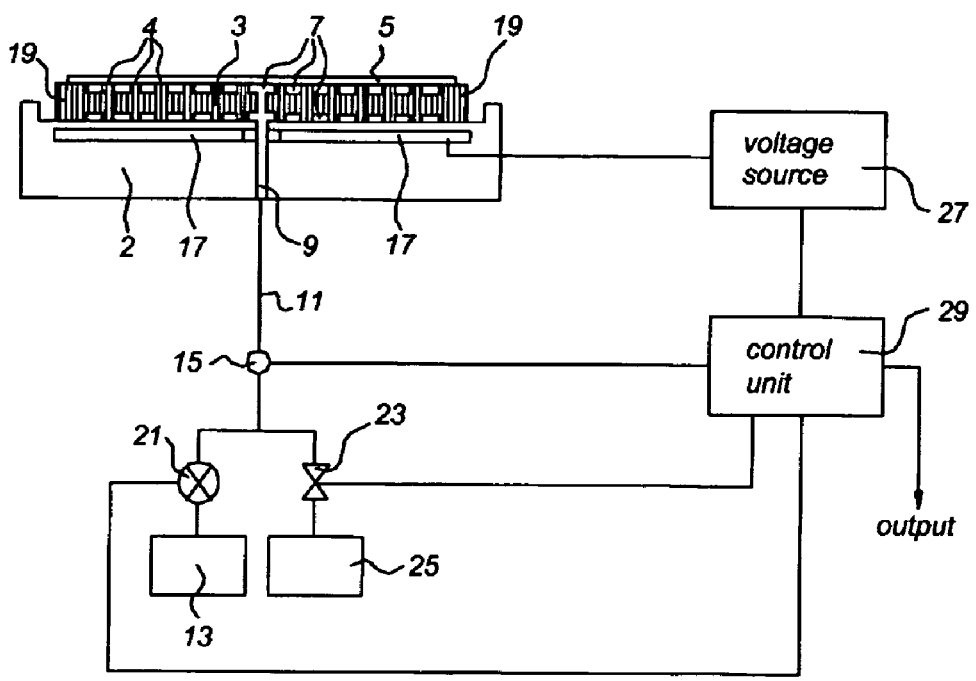
FIG. 2 shows a schematic setup of an embodiment of the invention.

The embodiment shown in FIG. 2 includes a support structure having a wafer chuck 2 on which a clamp 3 is positioned. On the surface of the clamp 3 protrusions 4 are present which define a support plane for an object to be clamped on the support structure. Between the protrusions 4 spaces 7 are present that are in communication with each other. As shown in the figure, a wafer 5 is placed on the clamp 3. The assembly of the wafer chuck 2, the clamp 3 and the wafer 5 defines a compartment comprising the spaces 7, which compartment is connected to a fluid storage chamber 13 via an inlet 9 and a supply channel 11. Preferably, the fluid used is a gas comprising argon and aspects of the invention will hereinafter be described according to this preferred embodiment. A sealing portion 19, arranged to prevent gas from entering the space housing the assembly is located between the wafer 5 and the wafer chuck 2. In the supply channel 11, a meter 15 is provided for measuring either the gas flow through the supply channel 11 or the pressure in the compartment. It is possible to change the pressure in the compartment by use of, for instance, a pump or a (reduction) valve 21 present in the supply channel 11.

The pump or valve 21 in the example of FIG. 2 is arranged to supply a so-called "back-fill gas" to the compartment. Moreover, a further valve 23 is provided in a branch of the supply channel 11 that is connected to a vacuum chamber 25. By opening the valve 23 any back-fill gas present in the compartment may be sucked away. The pump 21 is arranged to operate in two ways: i.e. it is able to increase and decrease the pressure in the compartment. Operated in the latter way, the pump 21 will remove the back-fill gas from the compartment. An electrode 17 is provided in the wafer chuck 2 which is adapted to exert an electrostatic force on the wafer 5 that attracts and consequently clamps the wafer 5 onto the clamp 3. To that end, the electrode 17 is supplied with a suitable supply voltage from a voltage source 27. In practice, this electrode 17 may be split in several electrode planes. One electrode plane is located in the clamp 3 and attracts the wafer 5 to the clamp 3 and with another electrode plane, also located in the clamp 3, the clamp 3 is clamped onto the wafer chuck 2. Another electrode plane, a ground electrode, is located in between the wafer chuck 2 and the clamp 3.

If the wafer 5 is clamped correctly the compartment should be substantially gas-tight. Here the term substantially gas-tight is used, as in practice there will always be some very small amount of gas leaking from the compartment.

After placing the wafer 5 on the clamp 3 either the flow or the pressure in the supply channel 11 is measured by the meter 15. This measurement is carried out as a function of time so two subsequent measurements will be taken in a time interval. If the flow does not reach a predetermined value, which preferably should be zero, and/or the pressure does not reach a predetermined pressure, which can be the end pressure, sufficiently fast, then it may be concluded that gas is leaking between the clamp 3/sealing portion 19 and wafer 5, which may be caused by misplacing the wafer 5 on the clamp 3. This will be discussed in more detail with reference to FIGS. 3 and 4.

A control unit 29 is provided, connected to the voltage source 27, the meter 15, the pump 21 and the valve 23. The control unit 29 is arranged to operate these components correctly in accordance with settings e.g. received from an operator, and to receive measurement values/operation conditions in return.

Moreover, the control unit 29 has an output to provide suitable output data to the operator, e.g. in the form of data for a printer (not shown), a monitor (not shown), etc. The control unit 29 may be implemented as a computer with suitable software, or as a controller with suitable analog and/or digital circuits. Moreover, the control unit 29 may actually comprise two or more sub-units each designed to perform one or more tasks.

Figure 3:
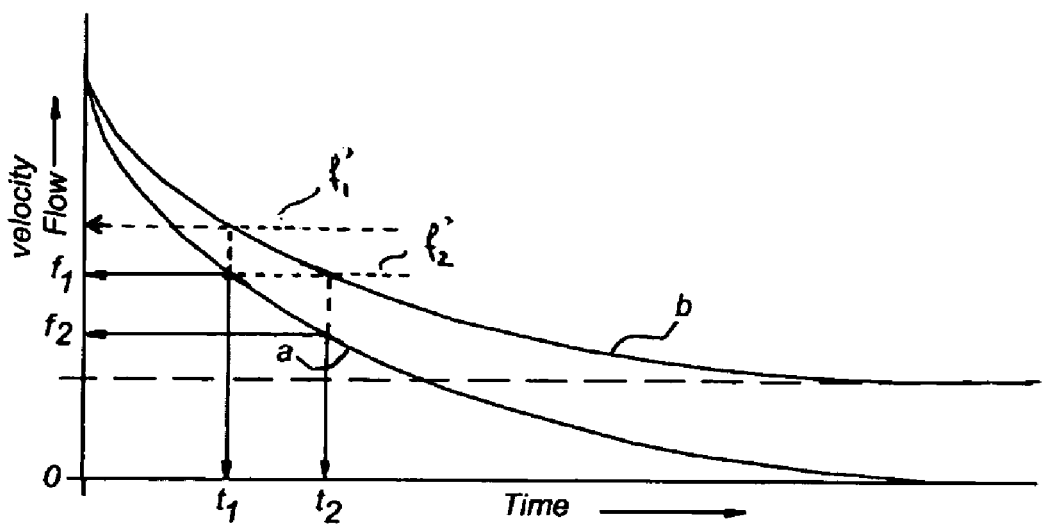
FIG. 3 is a graph of the flow velocity versus time for the gas in the supply system of an embodiment in accordance with the invention.
Figure 4:
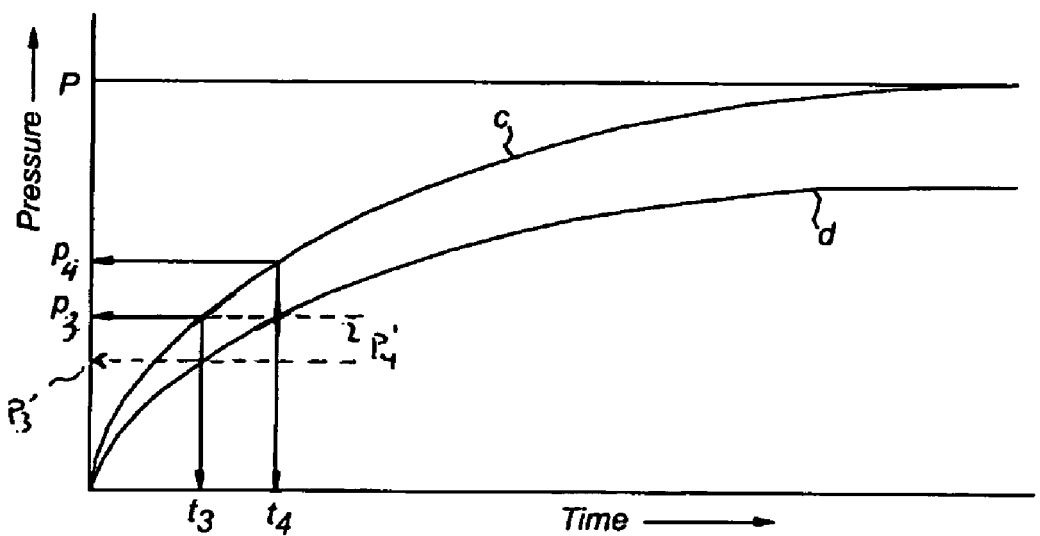
FIG. 4 is a graph of the pressure in the supply system versus time for an embodiment of an apparatus in accordance with the invention.

In FIGS. 3 and 4 the process of detecting correct placement of the wafer 5 is illustrated in more detail. FIG. 3 shows a graph representing the relationship between the flow velocity as a function of time for two cases. The curve labeled with an "a" represents the progress of the flow velocity in time in case that the wafer 5 is correctly clamped. It can be seen that as time progresses the flow velocity approaches zero and the compartment is substantially gas-tight, i.e. no gas is leaking from the compartment. The curve labeled with a "b", on the other hand, represents the case that the wafer 5 is not correctly clamped and the flow velocity does not reach a (near) zero value. This indicates that there is leakage of gas from the compartment and consequently that the wafer 5 is probably misplaced.

Similar considerations as described above apply to FIG. 4 in which the pressure measured in the supply channel 11 is plotted versus time. When the wafer 5 is correctly placed the pressure approaches a final pressure P as indicated by line "c". When this final pressure is not obtained sufficiently fast (curve "d"), this again means that there may be a wafer placement problem.

As can be clearly seen in both FIG. 3 and 4, the slopes of the curves b and d are quite different from the related curves a and c respectively. The slope of curve a is calculated as $(f_2-f_1)/(t_2-t_1)$ and the slope of curve b is calculated as $(f'_2-f'_1)/(t_2-t_1)$. The slope of curve c is calculated as $(p_4-p_3)/(t_4-t_3)$ and the slope of curve is calculated as $(p'_4-p'_3)/(t_4-t_3)$.

This means that by measuring a change in the flow velocity or pressure of the gas, it can be quickly determined whether or not the progress in flow velocity or pressure corresponds to the expected progress thereof. In particular it is no longer necessary to wait and see whether or not the expected end value of the flow velocity or the pressure of the gas will be reached. A measurement of change or progress can be made almost directly after supply of the gas to the compartment has begun. When the typical progress of the flow velocity and/or pressure of the gas is determined for a correctly clamped object, an early measurement in time will reveal whether or not the measured value of the flow velocity or pressure, i.e. the actual progress of that value, corresponds with the determined progress.

Figure 5:
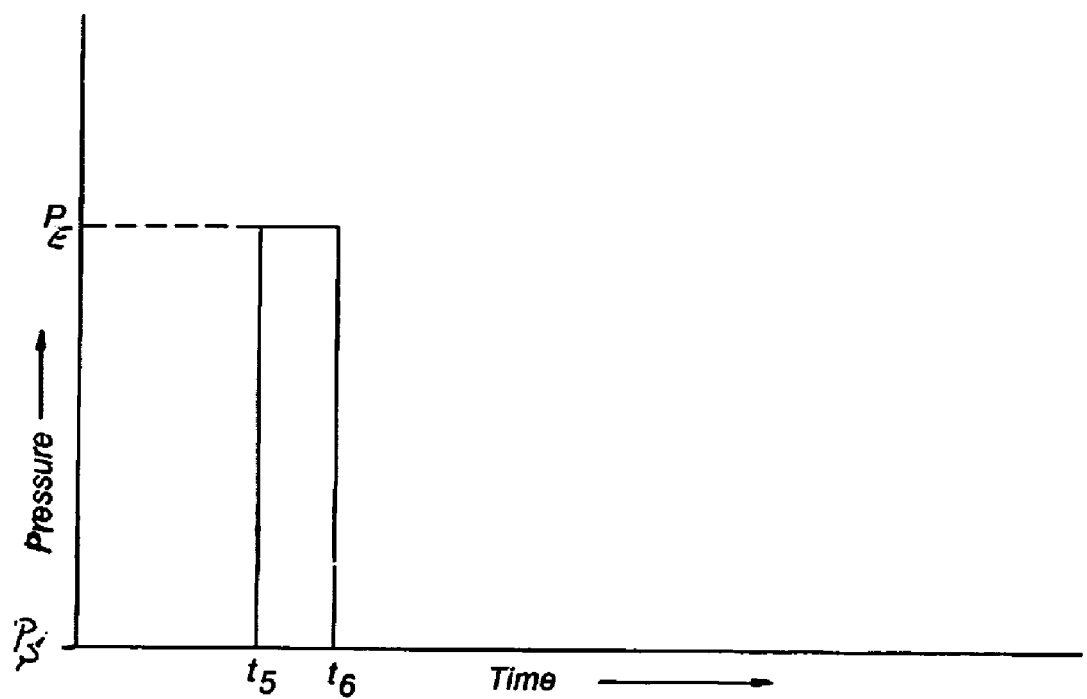
FIG. 5 illustrates a temporary increase in pressure which is used to test the effectiveness of the clamping in accordance with an embodiment of the invention.

FIG. 5 illustrates that in order to determine how firm the clamping between the wafer 5 and the clamp 3 is, the pressure of the gas in the compartment may, from a time t5 onwards temporarily be increased to an elevated pressure $P_E$, by use of pump 21. From a time t6 onwards the pressure is returned to the starting pressure (i.e. the pressure before t5) $P_S$. The increase in pressure (and subsequent decrease in pressure, though the latter is not strictly necessary) serves as a way to test that the wafer 5 is clamped sufficiently strong and will remain on the clamp during, for instance, transportation. The test works as follows: During the increase in pressure, this quantity is closely monitored by the meter 15 that for this purpose operates as a pressure meter. If the compartment is (substantially) gas-tight, the meter 15 will display the increase in pressure almost instantly. If not, this indicates leakage and a wrongly placed wafer 5.

Alternatively the meter 15 may be a flow velocity meter. Some time after the pressure increase, the flow velocity should be zero when the compartment is (substantially) gas-tight, indicating a correct wafer placement. Naturally, other pulse shapes than the pulse shape shown in FIG. 5 are possible.

While we have described above a specific embodiment of the invention it will be appreciated that aspects of the invention may be practiced otherwise than described. The description is not intended to limit aspects of the invention. In particular, it will be appreciated that aspects of the invention may be used in either or both the mask or substrate stage of a lithographic apparatus.

What is claimed is:

1. A lithographic apparatus comprising:
   at least one support structure adapted to clamp an object thereon, said support structure and said object clamped on said support structure defining a compartment, and
   a fluid supply structure in communication with said compartment, said fluid supply structure being constructed and arranged to supply a fluid to said compartment, wherein said fluid supply structure includes a flow velocity meter arranged to measure a change in flow velocity of said fluid as a function of time, in order to detect whether or not said object is correctly clamped on said support structure, said meter being connected to a control unit arranged to receive a value representative of said flow velocity of said fluid and arranged to determine a change in said flow velocity of said fluid as a function of time and to compare said change with a predetermined value of said change.

2. An apparatus according to claim 1, wherein the at least one support structure comprises:
   a first support structure for supporting a patterning device, said patterning device serving to pattern a beam of radiation according to a desired pattern to form a patterned beam,
   a second support structure for holding a substrate, and wherein said apparatus further comprises:
   a radiation system for providing said beam of radiation and
   a projection system for projecting said patterned beam onto a target portion of said substrate, and wherein at least one of said patterning device or said substrate is clamped on said first support structure or said second support structure, respectively.

3. An apparatus according to claim 1, wherein said fluid is a gas comprising argon.

4. An apparatus according to claim 1, wherein said fluid supply structure is adapted to increase pressure in said compartment from a first level to a second level during a predetermined period of time and subsequently decrease said pressure from said second level to a third level.

5. An apparatus according to claim 4, wherein said first, second, and third pressure levels are in the range of 8 mBar and 12 mBar.

6. An apparatus according to claim 4, wherein said period of time is in the range of 1 s and 30 s.

7. A method to detect correct clamping of an object on a support structure, which support structure and which object clamped on the support structure define a compartment, the method comprising:
  supplying a fluid to the compartment;
  measuring a change in flow velocity of the fluid as a function of time; and
  comparing said change with a predetermined value of said change.

8. A computer system to detect correct clamping of an object on a support structure, which support structure and which object clamped on the support structure define a compartment, the system comprising:
  means for supplying a fluid to the compartment;
  means for measuring a change in flow velocity of the fluid as a function of time; and
  means for comparing said change with a predetermined value of said change.

9. A computer-readable medium encoded with a computer program to detect correct clamping of an object on a support structure, which support structure and which object clamped on the support structure define a compartment, the program comprising:
  supplying a fluid to the compartment;
  measuring a change in flow velocity of the fluid as a function of time; and
  comparing said change with a predetermined value of said change.

10. A support structure assembly for use in a lithographic apparatus, comprising:
  at least one support structure adapted to clamp an object thereon, said support structure and the object clamped on said support structure defining a compartment, and
  a fluid supply structure in communication with said compartment, said fluid supply structure being constructed and arranged to supply a fluid to said compartment, wherein said fluid supply structure includes a flow velocity meter arranged to measure a change in flow velocity of said fluid as a function of time, in order to detect whether or not the object is correctly clamped on said support structure, said meter being connected to a control unit arranged to receive a value representative of said flow velocity of said fluid and arranged to determine a change in said flow velocity of said fluid as a function of time and to compare said change with a predetermined value of said change.

11. A lithographic apparatus comprising:
  at least one support structure adapted to clamp an object thereon, said support structure and said object clamped on said support structure defining a compartment, and
  a fluid supply structure in communication with said compartment, said fluid supply structure being constructed and arranged to supply a fluid to said compartment, wherein said fluid supply structure includes a meter arranged to measure a change in at least one of flow velocity of said fluid and pressure of said fluid as a function of time, in order to detect whether or not said object is correctly clamped on said support structure, said fluid supply structure being adapted to increase said pressure in said compartment from a first level to a second level during a predetermined period of time and subsequently decrease said pressure from said second level to a third level.

12. An apparatus according to claim 11, wherein said first, second, and third pressure levels are in the range of 8 mBar and 12 mBar.

13. An apparatus according to claim 11, wherein said period of time is in the range of 1 s and 30 s.

14. An apparatus according to claim 11, wherein the at least one support structure comprises:
  a first support structure for supporting a patterning device, said patterning device serving to pattern a beam of radiation according to a desired pattern to form a patterned beam, and
  a second support structure for holding a substrate, and wherein said apparatus further comprises:
  a radiation system for providing said beam of radiation and
  a projection system for projecting said patterned beam onto a target portion of said substrate, and wherein at least one of said patterning device or said substrate is clamped on said first support structure or said second support structure, respectively.

15. An apparatus according to claim 11, wherein said fluid is a gas comprising argon.

16. An apparatus according to claim 11, wherein said meter is a pressure meter connected to a control unit arranged to receive a value representative of said pressure of said fluid and arranged to determine a change in said pressure of said fluid as a function of time and to compare said change with a predetermined value of said change.

17. An apparatus according to claim 11, wherein said meter is a flow velocity meter connected to a control unit arranged to receive a value representative of said flow velocity of said fluid and arranged to determine a change in said flow velocity of said fluid as a function of time and to compare said change with a predetermined value of said change.

* * * * *